United States Patent
Aiba

(10) Patent No.: US 8,067,085 B2
(45) Date of Patent: Nov. 29, 2011

(54) GAS BARRIER FILM, AND DISPLAY DEVICE COMPRISING THE SAME

(75) Inventor: Satoshi Aiba, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 266 days.

(21) Appl. No.: 12/209,995

(22) Filed: Sep. 12, 2008

(65) Prior Publication Data

US 2009/0075003 A1    Mar. 19, 2009

(30) Foreign Application Priority Data

Sep. 14, 2007  (JP) ................................ 2007-238857
May 29, 2008  (JP) ................................ 2008-140980

(51) Int. Cl.
*B32B 27/06* (2006.01)
*B32B 27/30* (2006.01)
*B32B 33/00* (2006.01)
*B32B 38/00* (2006.01)

(52) U.S. Cl. ..................... 428/220; 428/335; 428/411.1; 428/500; 428/522; 156/310

(58) Field of Classification Search .......................... None
See application file for complete search history.

(56) References Cited

U.S. PATENT DOCUMENTS

2004/0209126 A1*  10/2004  Ziegler et al. ................. 428/702
2005/0012448 A1    1/2005  Ke et al.
2006/0251905 A1   11/2006  Arakawa
2007/0020451 A1*   1/2007  Padiyath et al. .............. 428/336
2008/0138624 A1*   6/2008  Lewis et al. ................... 428/412

FOREIGN PATENT DOCUMENTS

| CN | 1596561 A    | 3/2005 |
| EP | 1 842 873 A1 | 10/2007 |
| JP | 9-254303 A   | 9/1997 |
| JP | 2006-35737 A | 2/2006 |
| JP | 2007-30451 A | 2/2007 |

OTHER PUBLICATIONS

European Search Report issued in corresponding EP Application No. 08016209.2 dated Oct. 9, 2009.

Chinese Office Action dated Jun. 9, 2011 issued in corresponding Chinese Patent Application No. 200810215973.1 (with English translation).

* cited by examiner

*Primary Examiner* — Ramsey Zacharia

(74) *Attorney, Agent, or Firm* — Birch, Stewart, Kolasch & Birch, LLP

(57) ABSTRACT

Disclosed is a gas barrier film having, on one surface of a substrate film, a gas-barrier layer comprising at least one organic region and at least one inorganic region, and having, as a barrier property-having layer, only a layer comprising a barrier property-having resin as the main ingredient of the layer on the other surface of the substrate film. The gas barrier film has can effectively prevent moisture penetration through the other surface thereof not having the gas-barrier layer.

14 Claims, 1 Drawing Sheet

GAS BARRIER FILM, AND DISPLAY DEVICE COMPRISING THE SAME

FIELD OF THE INVENTION

The present invention relates to a gas barrier film and a method for producing the same, and to a display device comprising the gas barrier film.

BACKGROUND OF THE INVENTION

Heretofore, use of gas barrier films in display devices such as organic EL devices is investigated. JP-A 2007-30451 discloses a gas barrier film having a gas-barrier layer provided on one surface of a substrate film and having, as provided on the other surface of the substrate, a resin layer having a glass transition temperature of not lower than 60° C. JP-A 9-254303 discloses a gas barrier film having a gas-barrier layer provided on one surface of a substrate film and having a solvent-resistant layer provided on the other surface of the substrate film. In these gas barrier films, however, the moisture shieldability of the surface not coated with the gas-barrier layer is poor. Therefore, when such a film is used in a process of producing an organic EL device or the like, then the film may take moisture therein or may release the moisture that it has taken therein, therefore having some negative influences on the produced device.

On the other hand, JP-A 2006-35737 discloses a gas barrier film having an organic/inorganic laminate gas-barrier layer on both surfaces of a substrate film. However, in JP-A 2006-35737, since an organic/inorganic laminate gas-barrier layer is provided on both surfaces of a substrate, the production of such a film is difficult.

SUMMARY OF THE INVENTION

The object of the invention is to solve the above-mentioned problems, and to provide a gas barrier film having an organic/inorganic laminate gas-barrier layer only on one surface thereof, which can effectively prevent moisture penetration through the other surface thereof not having the gas-barrier layer.

Given that situation, the present inventors have assiduously studied and, as a result, have found that the above-mentioned problems can be solved by providing an organic/inorganic laminate gas-barrier layer on one surface of a substrate film and providing, as a barrier property-having layer, only a layer comprising a barrier property-having resin as the main ingredient of the layer (hereinafter the layer may be referred to as "barrier resin layer") on the other surface of the substrate film. Concretely, the invention has been achieved by the following constitutions.

(1) A gas barrier film having, on one surface of a substrate film, a gas-barrier layer comprising at least one organic region and at least one inorganic region, and having, as a barrier property-having layer, only a layer comprising a barrier property-having resin as the main ingredient of the layer on the other surface of the substrate film.

(2) The gas barrier film of (1), wherein the gas-barrier layer comprises at least one organic layer and at least one inorganic layer.

(3) The gas barrier film of (1) or (2), wherein the resin of the layer comprising a barrier property-having resin as the main ingredient of the layer is a polyvinyl alcohol.

(4) The gas barrier film of (1) or (2), wherein the resin of the layer comprising a barrier property-having resin as the main ingredient of the layer is a polyfunctional acrylate.

(5) The gas barrier film of any one of (2) to (4), wherein the organic layer is formed by curing a composition comprising at least one (meth)acrylate having a bisphenol skeleton.

(6) The gas barrier film of any one of (2) to (5), wherein the main ingredient of the layer comprising a barrier property-having resin as the main ingredient of the layer is the same as the main ingredient of the organic layer.

(7) The gas barrier film of any one of (2) and (4) to (6), wherein both of the main ingredient of the organic layer and the layer comprising a barrier property having resin as the main ingredient of the layer are derived from (meth)acrylate.

(8) The gas barrier film of any one of (1) to (7), wherein the thickness of the layer comprising a barrier property-having resin as the main ingredient of the layer is from 0.5 to 30 μm.

(9) The gas barrier film of any one of (1) to (8), which has a thickness of from 10 to 300 μm.

(10) The gas barrier film of any one of (1) to (9), which is for display devices.

(11) A method for producing the gas barrier film of any one of (1) to (10), which comprises providing the gas-barrier layer on a surface of a substrate film and then providing, on the other surface of the substrate film, the layer comprising a barrier property-having resin as the main ingredient of the layer.

(12) A display device comprising the gas barrier film of any one of (1) to (10).

(13) The display device of (12), wherein the gas barrier film is used for a substrate of the display device.

(14) The display device of (12), wherein the gas barrier film is used for a sealing film of the display device.

(15) The display device of any one of (12) to (14), wherein the gas barrier film is provided in such a manner that the layer comprising a barrier property-having resin as the main ingredient of the layer is on the outer side of the device.

Although the gas barrier film of the invention has an organic/inorganic laminate gas-barrier layer only on one surface thereof, the gas barrier film makes it possible to prevent moisture and gas from being taken into and being released from the substrate film. As a result, when used in producing a display device such as an organic EL device, the gas barrier film may reduce the deterioration of the display device to be produced, therefore making it possible to stably produce display devices.

DESCRIPTION OF SPECIFIC EMBODIMENTS

Figure 1:
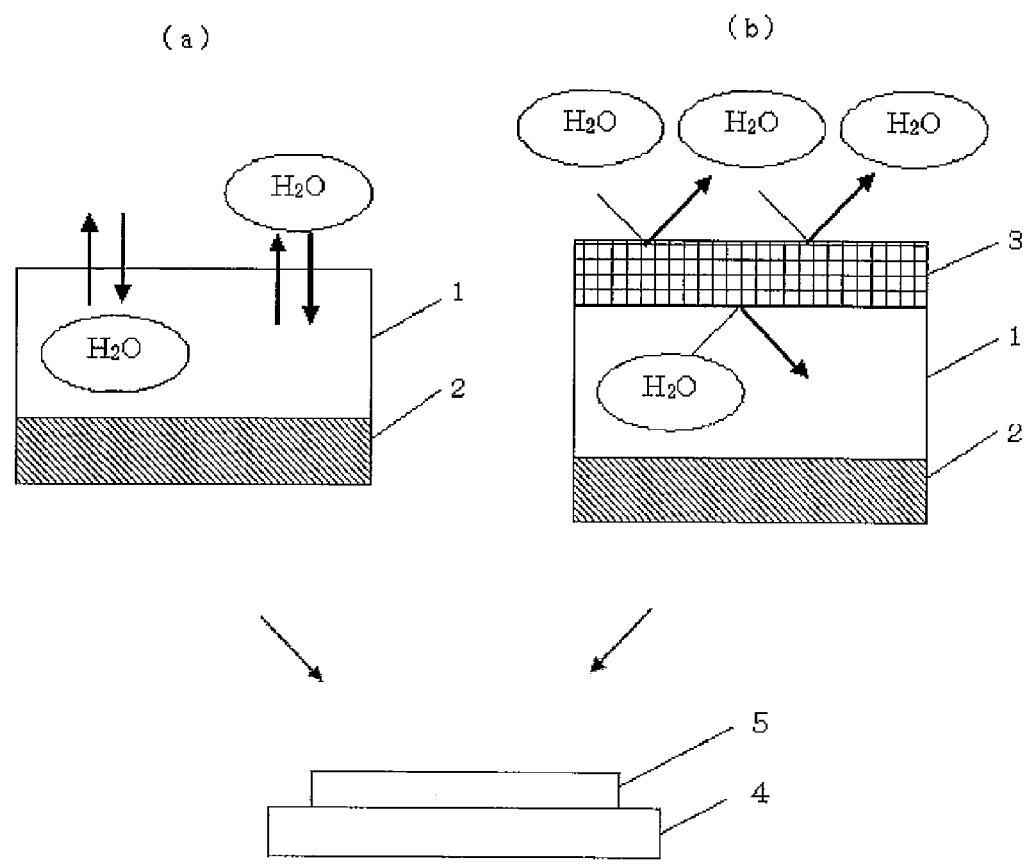
FIG. 1 shows outline views of cases where a conventional gas barrier film and a gas barrier film of the invention are used as a sealing film for an organic EL device.

The contents of the invention are described in detail hereinunder. In this description, the numerical range expressed by the wording "a number to another number" means the range that falls between the former number indicating the lowermost limit of the range and the latter number indicating the uppermost limit thereof. The organic EL device as referred to herein means an organic electroluminescent device.

The gas barrier film of the invention is characterized by having, on one surface of a substrate film, a gas-barrier layer comprising at least one organic region and at least one inorganic region (in this description, this may be referred to as "organic/inorganic laminate gas-barrier layer"), and having, as a barrier property-having layer, only a layer comprising a barrier property-having resin as the main ingredient of the layer (barrier resin layer) on the other surface of the substrate film.

The barrier resin layer contains a barrier property-having resin as the first ingredient constituting the layer, and in general, it contains a barrier property-having resin in an amount of at least 80% by weight. Accordingly, the invention should not exclude the concept of containing any other ingredient within a range not overstepping the scope and the gist of the invention. The wording "as a barrier property-having layer, only a layer is provided" means that only the barrier resin layer is provided as a barrier property-having layer and that any other functional layer may be provided. In other words, embodiments having any other gas-barrier layer provided therein are not within the scope of the invention, but embodiments having, as provided therein, an adhesive layer for adhering a barrier resin layer and a substrate film and/or having any other functional layer are within the scope of the invention.

An example of using the gas barrier film of the invention as a sealing film for an organic EL device is described below. Needless-to-say, the invention is not limited to this embodiment.

FIG. 1 shows outline views of cases where a conventional gas barrier film and a gas barrier film of the invention are used as a sealing film for an organic EL device, in which (a) shows a conventional gas barrier film and (b) shows a gas barrier film of the invention. In this, 1 is a substrate film, 2 is an organic/inorganic laminate gas-barrier layer, and 3 is a barrier resin layer. (c) shows an organic EL device, which comprises a substrate 4 and, as provided on the substrate, a laminate 5 comprising a pair of electrodes and an organic compound layer or the like provided between the electrodes.

In the conventional gas barrier film (a), moisture penetrates into the substrate film 1, and the gas barrier film with moisture kept therein is stuck to an organic EL device and is therefore problematic in that the device is deteriorated by moisture. On the other hand, in the gas barrier film (b) of the invention, moisture penetration is blocked by the organic/inorganic laminate gas-barrier layer 2 and the barrier resin layer 3.

In FIG. 1, the gas barrier film is used as a sealing film for an organic EL device; however, the gas barrier film of the invention can be used as a substrate of an organic EL device or as both the two. In addition, it may also be used for any other display device. Also in these cases, the gas barrier film is preferably provided in such a manner that the barrier resin layer could be on the outer side of the display device.

Preferably, the thickness of the gas barrier film of the invention is from 10 to 300 μm, more preferably from 25 to 250 μm.

(Layer Comprising Barrier Property-Having Resin as the Main Ingredient)

In the layer comprising a barrier property-having resin as the main ingredient of the layer (barrier resin layer) of the invention, the barrier property-having resin means a material capable of inhibiting diffusion of a gaseous component such as oxygen and moisture that may have some influences on the materials constituting organic EL devices. Concretely, it includes polyvinyl alcohol, polyvinylidene chloride copolymer, ethylene/vinyl alcohol copolymer, synthetic mica-containing resin layer, and polyfunctional acrylate usable in the organic layer of organic/inorganic laminate gas-barrier layer; and preferred are polyvinyl alcohol and polyfunctional acrylate.

Preferably, the main ingredient of the barrier resin layer is the same as that of the organic layer constituting the gas-barrier layer. The advantage of this constitution is that the film formation is easy.

Regarding the gas-barrier property of the barrier resin layer, the water vapor permeability of the barrier resin layer, as measured at 25° C. and 50% RH, is preferably from 0.001 to 10 $g/m^2$ day.

The thickness of the barrier resin layer is preferably from 0.5 to 30 μm, more preferably from 1 to 20 μm.

Preferably, the barrier resin layer is formed by applying a resin composition onto a substrate film; however, also employable is a different method of sticking a resin film to a substrate film with an adhesive or the like.

(Gas-Barrier Layer)

The gas-barrier layer of the invention is a layer having a function of blocking oxygen and moisture in air, and is an organic/inorganic laminate-type which has a laminate constitution of an organic region and an inorganic region, or at least one organic layer and at least one inorganic layer.

The organic region and the inorganic region, or the organic layer and the inorganic layer are, in general, alternately laminated. When the gas-barrier layer comprises an organic region and an inorganic region, it may be a graded material layer where the regions continuously change in the direction of the thickness of the film. Examples of the graded materials include the materials described in a report by Kim et al., in Journal of Vacuum Science and Technology A, Vol. 23, pp. 971-977 (2005 American Vacuum Society); and a continuous laminate of an organic layer and an organic layer with no interface therebetween as in USP-A 2004-46497. For simplifying the description hereinunder, the organic layer and the organic region are expressed as "organic layer" and the inorganic layer and the inorganic region are as "inorganic layer".

The number of the layers constituting the gas-barrier layer is not specifically defined, but typically, the gas-barrier layer preferably comprises from 2 layers to 30 layers, more preferably from 3 layers to 20 layers. The thickness of the gas-barrier layer is not specifically defined, and, for example, is 0.2 μm to 30 μm, preferably 0.5 μm to 15 μm.

(Inorganic Layer)

The inorganic layer is, in general, a layer of a thin film formed of a metal compound. For forming the inorganic layer, employable is any method capable of producing the intended thin film. For it, for example, suitable is a coating method, sputtering method, a vacuum evaporation method, an ion-plating method or a plasma CVD method. Concretely, the methods described in Japanese Patent No. 3400324, JP-A 2002-322561, 2002-361774 are employable herein.

Not specifically defined, the component to be in the inorganic layer may be any one that satisfies the above-mentioned performance, for which, for example, employable are oxides, nitrides or oxinitrides containing at least one metal selected from Si, Al, In, Sn, Zn, Ti, Cu, Ce and Ta. Of those preferred are oxides, nitrides or oxinitrides of a metal selected from Si, Al, In, Sn, Zn and Ti; and more preferred are metal oxides, nitrides or oxinitrides with Si or Al. These may contain any other element as a subsidiary component.

Not specifically defined, the thickness of the inorganic layer is preferably within a range of from 5 nm to 500 nm, more preferably from 10 nm to 200 nm. Two or more inorganic layers may be laminated, and in such a case, the constitutive layers may have the same or different compositions. The inorganic layer also may be included as a layer have a composition continuously changing in the direction of the layer thickness with no definite interface between an organic layer and an inorganic layer, as illustrated in USP-A 2004-46497.

(Organic Layer)

In the invention, the organic layer is preferably formed of a polymer of a radical-polymerizing compound and/or a cationic-polymerizing compound having an ether group as a functional group.

(Polymerizing Compound)

The polymerizing compound for use in the invention is a compound having an ethylenic unsaturated bond at the terminal or in the side chain thereof, and/or a compound having an epoxy or oxetane at the terminal or in the side chain thereof. Of those, preferred is a compound having an ethylenic unsaturated bond at the terminal or in the side chain thereof.

Examples of the compound having an ethylenic unsaturated bond at the terminal or in the side chain thereof includes (meth)acrylate compounds (acrylate and methacrylate are expressed as (meth)acrylate as combined), acrylamide compounds, styrene compounds, maleic anhydride, etc.

As (meth)acrylate compounds, preferred are (meth)acrylates, urethane-(meth)acrylates, polyester-(meth)acrylates, epoxy(meth)acrylates, etc.

As styrene compounds, preferred are styrene, α-methylstyrene, 4-methylstyrene, divinylbenzene, 4-hydroxystyrene, 4-carboxystyrene, etc.

Specific examples of (meth)acrylate compounds are mentioned below, to which, however, the invention should not be limited.

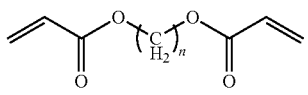
n = 4, 6, 9, 10, 12, 14, 16

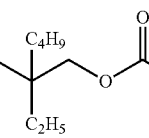

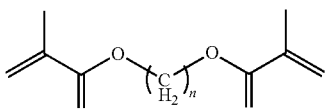
n = 4, 6, 9, 10, 12, 14, 16

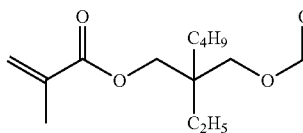

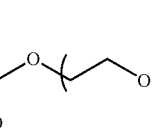

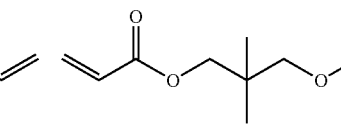
n = 2, 3, 4, 5

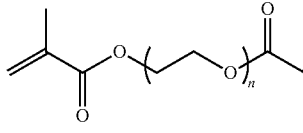
n = 2, 3, 4, 5

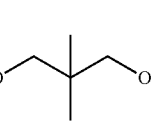

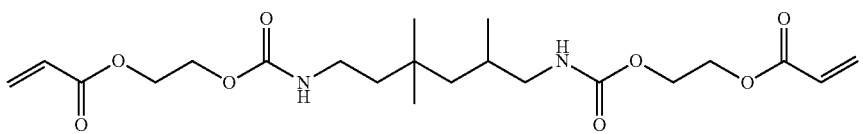

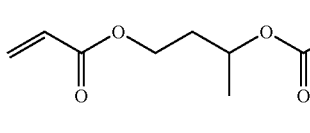

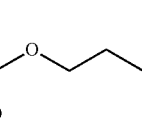

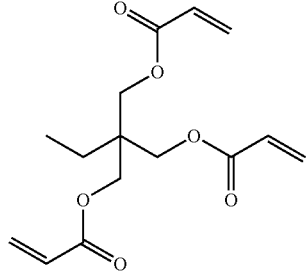

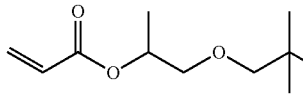

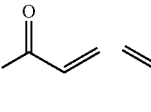

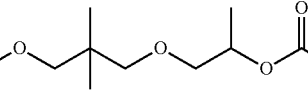

-continued
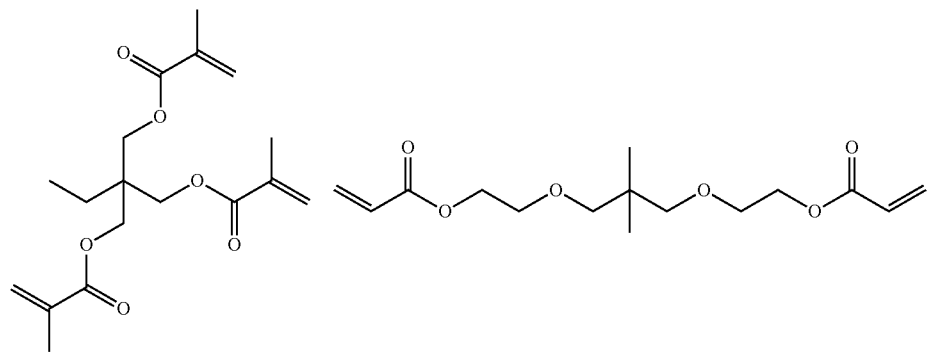
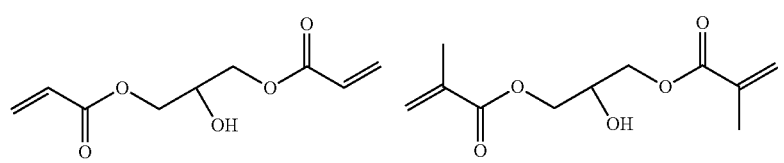
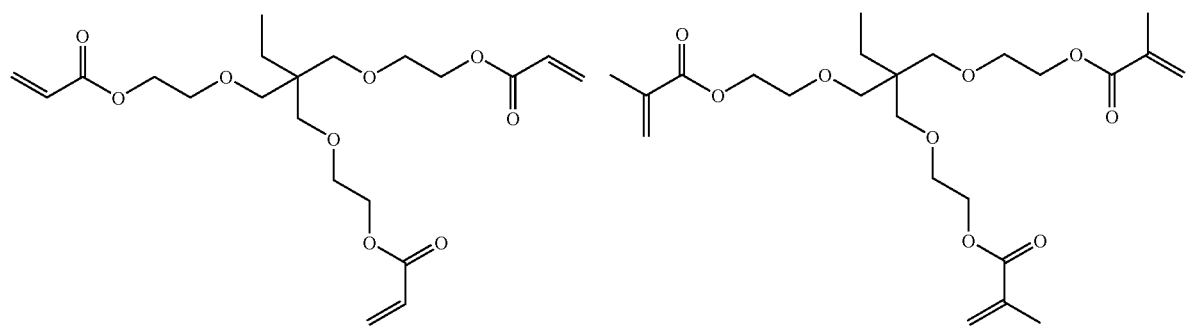
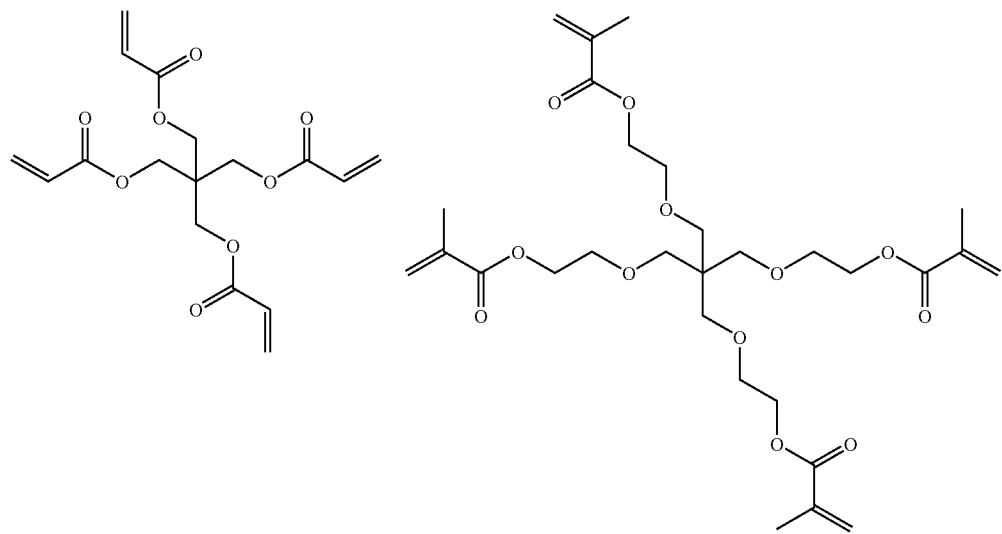

-continued
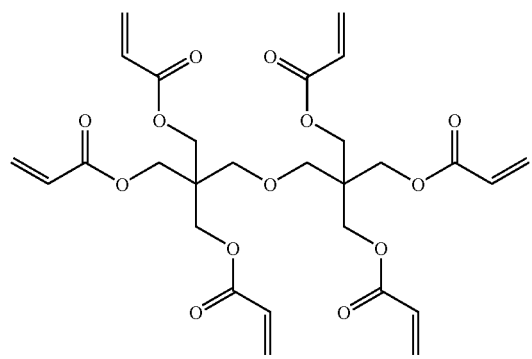
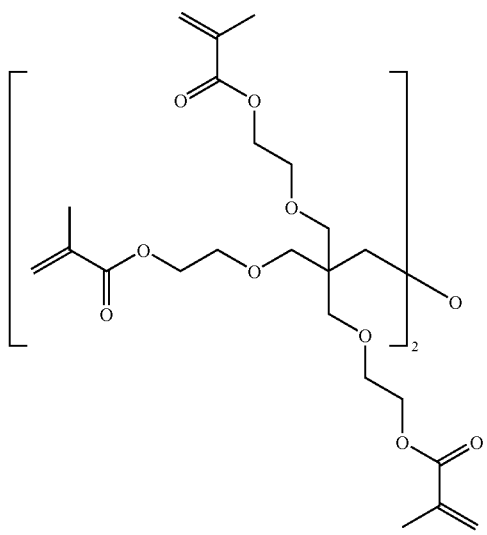
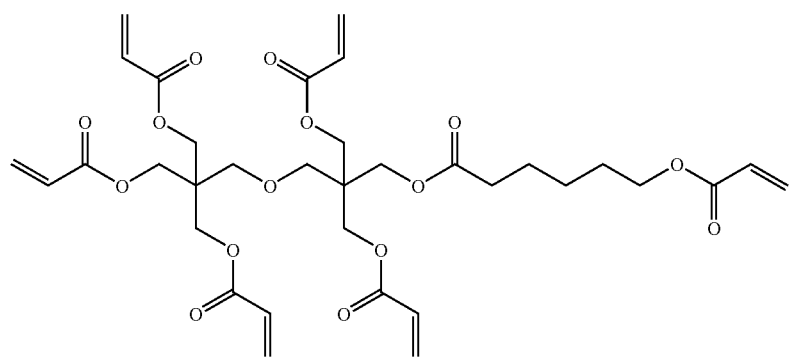
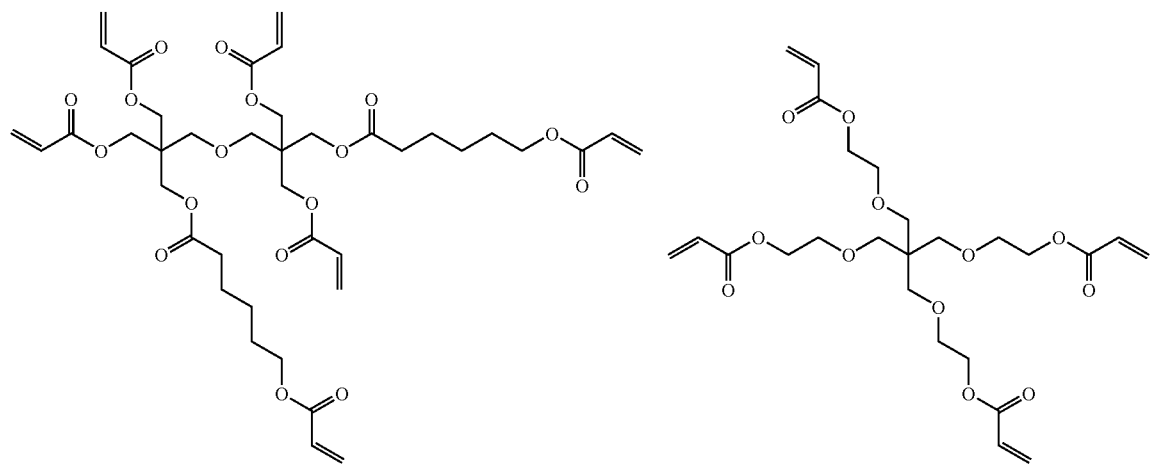

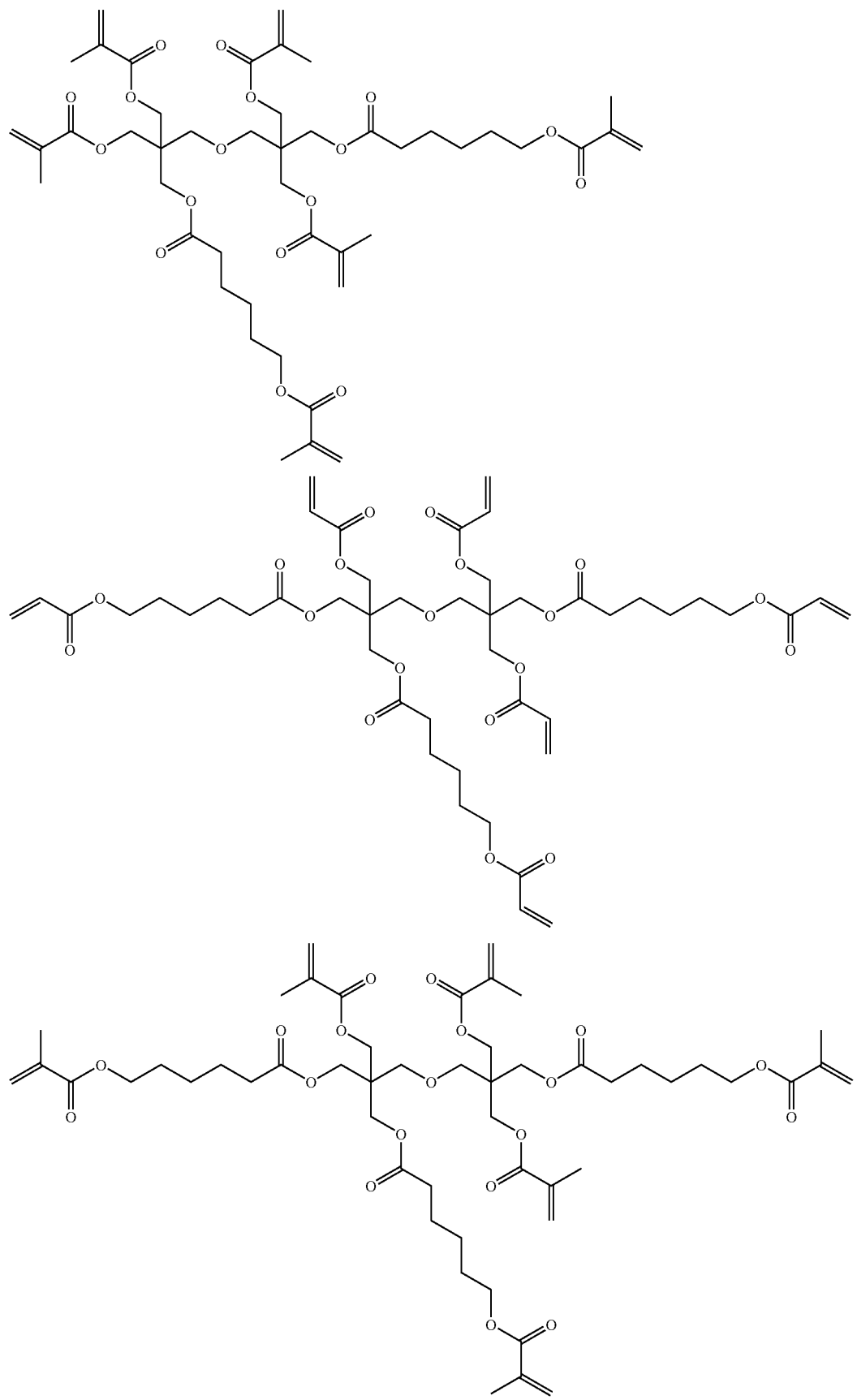

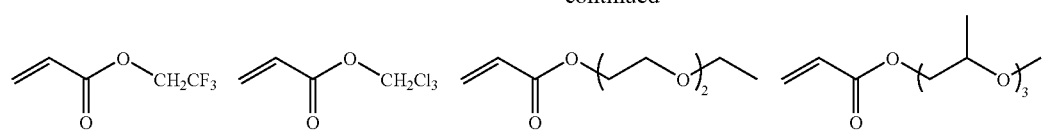
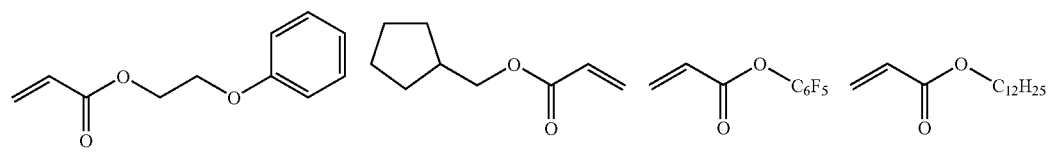
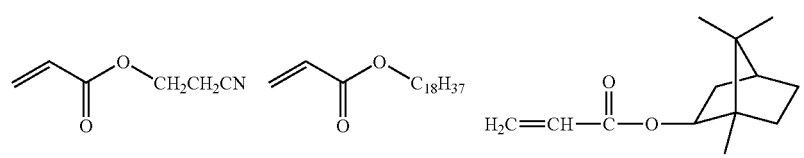
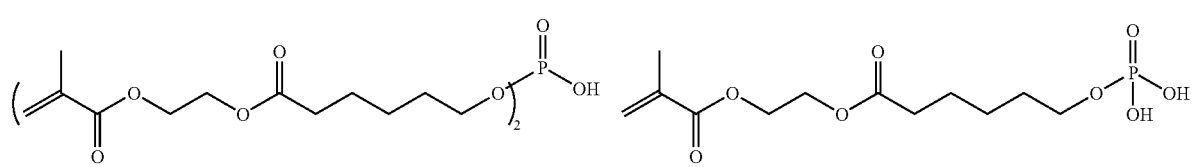
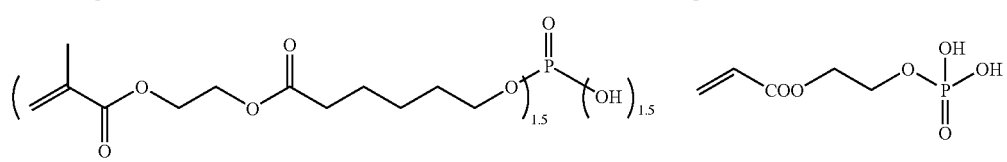
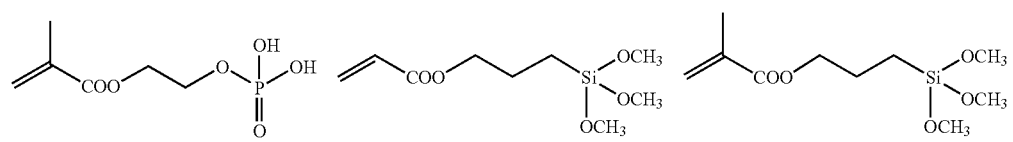
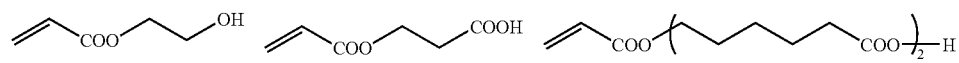
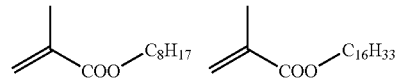
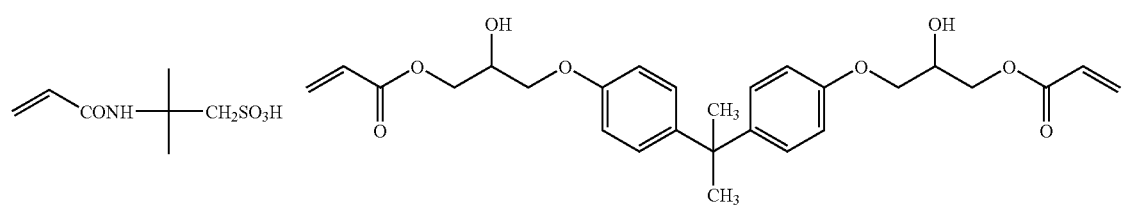
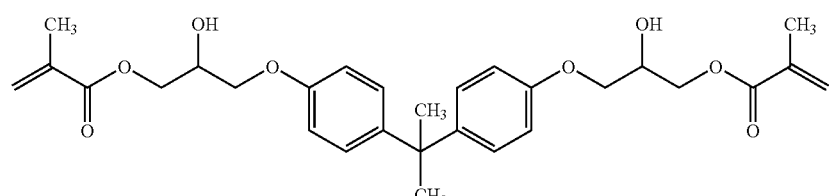
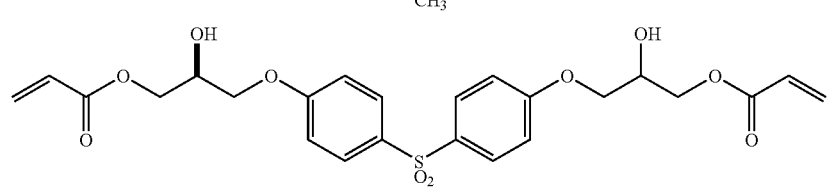

-continued

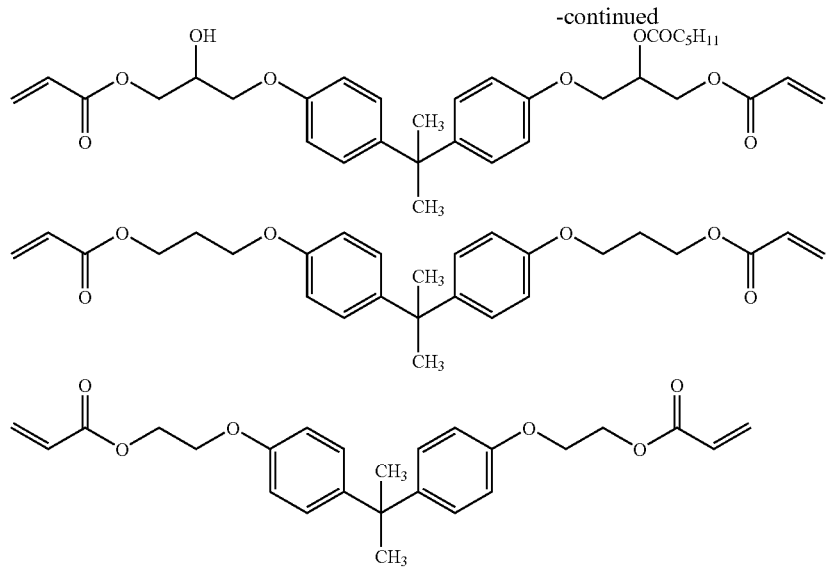

(Polymerization Initiator)

The organic layer of the invention is generally obtained by coating and curing the polymerizing composition and, the polymerizing composition in the invention may contain a polymerization initiator. In the case where a photopolymerization initiator is used, its amount is preferably at least 0.1 mol % of the total amount of the polymerizing compound, more preferably from 0.5 to 2 mol %. By setting the thus-designed composition, polymerization reaction though an active ingredient forming reaction may be suitably controlled. Examples of the photopolymerization initiator include Ciba Speciality Chemicals' commercial products, Irgacure series (e.g., Irgacure 651, Irgacure 754, Irgacure 184, Irgacure 2959, Irgacure 907, Irgacure 369, Irgacure 379, Irgacure 819), Darocure series (e.g., Darocure TPO, Darocure 1173), Quantacure PDO; Sartomer's commercial products, Ezacure series (e.g., EzacureTZM, EzacureTZT), etc.

(Method of Formation of Organic Layer)

The method for forming the organic layer is not specifically defined. For example, the layer may be formed according to a solution coating method or a vacuum film formation method. The solution coating method is, for example, a dipping method, an air knife coating method, a curtain coating method, a roller coating method, a wire bar coating method, a gravure coating method, a slide coating method, or an extrusion coating method using a hopper as in U.S. Pat. No. 2,681, 294. The vacuum film formation method is not specifically defined, but is preferably a film formation method by vapor deposition or plasma CVD. In the invention, the polymer may be applied for coating as its solution, or a hybrid coating method along with an inorganic material, as in JP-A 2000-323273 and 2004-25732, may also be used.

(Method of Crosslinking of Polymerizing Compound)

In the invention, the above-mentioned polymerizing compound is polymerized and crosslinked through irradiation with heat or various energy rays, thereby forming an organic layer comprising a polymer as the main ingredient thereof. Examples of energy rays include UV rays, visible rays, IR rays, electron rays, X rays, gamma rays, etc. In the case where the compound is polymerized by heat, then a thermal polymerization initiator may be used; where it is polymerized with UV rays, then a photopolymerization initiator may be used; and where it is polymerized with visible rays, then a photopolymerization initiator and a sensitizer may be used. Of the above, preferred is a method of polymerizing and crosslinking a polymerizing compound in the presence of a photopolymerization initiator.

In the invention, in general, a polymerizing compound-containing composition is cured through irradiation with light, and the light for radiation is generally a UV ray from a high-pressure mercury lamp or low-pressure mercury lamp. The radiation energy is preferably at least 0.5 J/cm$^2$, more preferably at least 2 J/cm$^2$. (Meth)acrylate compounds may suffer from interference in polymerization owing to oxygen in air, and therefore, in their polymerization, the oxygen concentration or the oxygen partial pressure is preferably lowered. In the case where the oxygen concentration in polymerization is lowered according to a nitrogen purging method, the oxygen concentration is preferably at most 2%, more preferably at most 0.5%. In the case where the oxygen partial pressure in polymerization is lowered by a pressure reduction method, the whole pressure is preferably at most 1000 Pa, more preferably at most 100 Pa. Especially preferred is UV polymerization with at least 2 J/cm$^2$ energy radiation under a condition of reduced pressure of at most 100 Pa.

The organic layer is preferably smooth. Regarding the smoothness of the organic layer, the mean roughness (Ra) of 1 μm$^2$ of the layer is preferably at most 1 nm, more preferably at most 0.5 nm. Preferably, the rate of polymerization of monomer is at least 85%, more preferably at least 88%, even more preferably at least 90%, still more preferably at least 92%. The rate of polymerization as referred to herein means the ratio of the reacted polymerizing group to all the polymerizing group (acryloyl group and methacryloyl group) in the monomer mixture. The rate of polymerization may be quantitatively determined according to IR absorptiometry.

The thickness of the organic layer is not specifically defined. However, when the layer is too thin, then its thickness could hardly keep uniformity; but when too thick, the layer may be cracked by external force applied thereto and its barrier-property may lower. From these viewpoints, the thickness of the organic layer is preferably from 50 nm to 2000 nm, more preferably from 200 nm to 1500 nm.

As so mentioned in the above, the organic layer is preferably smooth. Regarding the smoothness of the organic layer, the mean roughness (Ra) of 1 μm$^2$ of the layer is preferably at most 1 nm, more preferably at most 0.5 nm. The surface of the organic layer is required not to have impurities and projections such as particles. Accordingly, it is desirable that the organic layer is formed in a clean room. The degree of cleanness is preferably at most class 10000, more preferably at most class 1000.

Preferably, the hardness of the organic layer is higher. It is known that, when the hardness of the organic layer is high, then the inorganic layer may be formed smoothly and, as a result, the barrier level of the gas barrier film is thereby improved. The hardness of the organic layer may be expressed as a microhardness based on a nano-indentation method. The microhardness of the organic layer is preferably at least 150 N/mm, more preferably at least 180 N/mm, even more preferably at least 200 N/mm.

Two or more organic layers are preferably laminated. In this case, each layer may have the same composition or may have different compositions. In this case, it is preferred that at least one layer is the above-mentioned organic layer, and the other organic layer may be the above-mentioned organic layer or an organic layer derived from other composition. The organic layer also may be included as a layer have a composition continuously changing in the direction of the layer thickness with no definite interface between an organic layer and an inorganic layer, as illustrated in USP-A 2004-46497.
(Substrate Film)

In the gas barrier film of the invention, a plastic film is in general used as the substrate film. The plastic film to be used is not particularly limited with respect to the material quality and thickness, etc. so far as it is a film capable of keeping a laminate of an organic layer, an inorganic layer and the like and can be properly chosen depending upon the use purpose or the like. Specific examples of the plastic film include thermoplastic resins such as polyester resins, methacrylic acid-maleic acid copolymers, polystyrene resins, transparent fluorocarbon resins, polyimides, fluorinated polyimide resins, polyamide resins, polyamide-imide resins, polyetherimide resins, cellulose acylate resins, polyurethane resins, polyetheretherketone resins, polycarbonate resins, alicyclic polyolefin resins, polyarylate resins, polyethersulfone resins, polysulfone resins, cycloolefin copolymers, fluorene ring-modified polycarbonate resins, alicyclic modified polycarbonate resins, fluorene ring-modified polyester resins and acryloylated compounds. Of those, polyester resin such as polyethylene terephthalate (PET), polyethylene naphthalate (PEN) is preferable.

In the case where the gas barrier film of the invention is used as a substrate of a device such as organic EL devices as described later, it is preferable that the plastic film is composed of a raw material with heat resistance. Specifically, it is preferable that the plastic film is composed of a transparent raw material with high heat resistance having a glass transition temperature (Tg) of 100° C. or higher and/or a linear heat expansion coefficient of not more than 40 ppm/° C. The Tg and linear heat expansion coefficient can be adjusted by an additive or the like. Examples of such a thermoplastic resin include polyethylene naphthalate (PEN: 120° C.), polycarbonate (PC: 140° C.), alicyclic polyolefins (for example, ZEONOR 1600, manufactured by Zeon Corporation: 160° C.), polyarylate (PAr: 210° C.), polyethersulfone (PES: 220° C.), polysulfone (PSF: 190° C.), cycloolefin copolymers (COC: a compound described in Example 1 of JP-A-2001-150584: 162° C.), polyimides (for example, NEOPULIM, manufactured by Mitsubishi Gas Chemical Company, Inc.: 260° C.), fluorene ring-modified polycarbonate (BCF-PC, a compound described in JP-A-2000-227603: 225° C.), alicyclic modified polycarbonate (IP-PC, a compound described in JP-A-2000-227603: 205° C.) and acryloyl compound (a compound described in JP-A-2002-80616: 300° C. or higher) (the numerical figure in each of the parentheses indicates Tg). In particular, in the case where the transparency is required, it is preferable to use an alicyclic polyolefin or the like.

In the case where the gas barrier film of the invention is used in combination with a polarizing plate, it is preferable that the gas barrier layer surface of the gas barrier film (surface on which the laminate including at least one inorganic layer and at least one organic layer is formed) is faced at the inside of a cell and is disposed in the innermost (adjacent to the device). At that time, since the gas barrier film is disposed in the inside of the cell relative to the polarizing plate, a retardation value of the gas barrier film is important. As to a use form of the gas barrier film in such an embodiment, it is preferable that a barrier film using a base material film having a retardation value of not more than 10 nm and a circular polarizing plate ((quarter-wave plate)+(half-wave plate)+(linear polarizing plate)) are laminated and used, or that a linear polarizing plate is combined with a gas barrier film using a base material film having a retardation value of from 100 nm to 180 nm, which can be used as a quarter-wave plate, and used.

Examples of the base material film having a retardation of not more than 10 nm include cellulose triacetate (FUJITAC, manufactured by Fujifilm Corporation), polycarbonates (PURE-ACE, manufactured by Teijin Chemicals Ltd.; and ELMECH, manufactured by Kaneka Corporation), cycloolefin polymers (ARTON, manufactured by JSR Corporation; and ZEONOR, manufactured by Zeon Corporation), cycloolefin copolymers (APEL (pellet), manufactured by Mitsui Chemicals, Inc.; and TOPAS (pellet), manufactured by Polyplastics Co., Ltd.), polyarylates (U100 (pellet), manufactured by Unitika Ltd.) and transparent polyimides (NEOPULIM, manufactured by Mitsubishi Gas Chemical Company).

Also, films obtained by properly stretching the foregoing film to adjust it so as to have a desired retardation value can be used as the quarter-wave plate.

In view of the matter that the gas barrier film of the invention is utilized as a device such as organic EL devices, the plastic film must be transparent, namely its light transmittance is usually 80% or more, preferably 85% or more, and more preferably 90% or more. The light transmittance can be measured by a method described in JIS-K7105, namely by measuring a total light transmittance and an amount of scattered light using an integrating sphere type light transmittance analyzer and subtracting the diffuse transmittance from the total light transmittance.

Even in the case where the gas barrier film of the invention is used for display use, for example, when it is not disposed on the side of an observer, the transparency is not always required. Accordingly, in such case, an opaque material can also be used as the plastic film. Examples of the opaque material include known liquid crystal polymers such as polyimides and polyacrylonitrile.

The thickness of the plastic film to be used for the gas barrier film of the invention is properly chosen depending upon the use and therefore, is not particularly limited. It is typically from 1 to 800 μm, and preferably from 10 to 200 μm. These plastic films may have a functional layer such as a transparent conductive layer and a primer layer. The functional layer is described in detail in paragraphs 0036 to 0038 of JP-A-2006-289627. Examples of functional layers other than these layers include a matting agent layer, a passivation layer, an antistatic layer, a smoothening layer, an adhesion improving layer, a light shielding layer, an antireflection layer, a hard coat layer, a stress relaxing layer, an antifogging layer, an antifouling layer, a layer to be printed and an easily adhesive layer.]

(Display Device)

The display devices of the invention include liquid crystal display devices, touch panels, organic EL devices, thin-film transistor (TFT) imaging display devices, and electronic papers.

(Liquid Crystal Display Device)

The reflection type liquid crystal display device is configured to include a lower substrate, a reflection electrode, a lower alignment film, a liquid crystal layer, an upper alignment film, a transparent electrode, an upper substrate, a $\lambda/4$ plate and a polarizing film in order from the lower side. In the case of giving a color displaying function to the reflection type liquid crystal display device, it is preferable to further provide a color filter layer between the reflection electrode and the lower alignment film or between the upper alignment film and the transparent electrode.

Also, the transmission type liquid crystal display device is configured to include a backlight, a polarizing plate, a $\lambda/4$ plate, a lower transparent electrode, a lower alignment film, a liquid crystal layer, an upper alignment film, an upper transparent electrode, an upper substrate, a $\lambda/4$ plate and a polarizing plate in order from the lower side. Also, in the case of giving a color displaying function to the transmission type liquid crystal display device, it is preferable to further provide a color filter layer between the lower transparent electrode and the lower alignment film or between the upper alignment film and the upper transparent electrode.

Though the structure of the liquid crystal layer is not particularly limited, it is preferably of, for example, a TN (twisted nematic) type, an STN (super twisted nematic) type, an HAN (hybrid aligned nematic) type, a VA (vertically alignment) type, an ECB (electrically controlled birefringence) type, an OCB (optically compensated bend) type, a CPA (continuous pinwheel alignment) type or an IPS (in-plane switching) type.

(Touch Panel)

As the touch panel, one obtained by applying the gas barrier film of the invention onto a substrate described in, for example, JP-A-5-127822 or JP-A-2002-48913 can be used.

(Organic EL Device)

An "organic EL device" means an organic electroluminescent device. The organic EL device has a cathode and an anode on a substrate and has an organic compound layer including an organic light-emitting layer between the both electrodes. In view of properties of the light-emitting device, it is preferable that at least one electrode of the anode and the cathode is transparent.

In the invention, an embodiment of the laminate of the organic compound layer is preferably an embodiment in which a hole transport layer, a light-emitting layer and an electron transport layer are laminated in order from the anode side. Furthermore, a charge blocking layer may be provided between the hole transport layer and the light-emitting layer or between the light-emitting layer and the electron transport layer. A hole injection layer may be provided between the anode and the hole transport layer; and an electron injection layer may be provided between the cathode and the electron transport layer. The light-emitting layer may comprise only one layer, or may be divided into a first light-emitting layer, a second light-emitting layer, and a third light-emitting layer, and the like. Each of the layers may be divided into plural secondary layers.

Hereinafter, each element constituting the organic EL device is described in detail.

Substrate

As the substrate for use in the organic EL device of the invention, usable is the gas barrier film of the invention or a substrate for use in known organic EL devices. When a gas barrier film is used as a substrate, usable are gas barrier films described in JP-A-2004-136466, JP-A-2004-148566, JP-A-2005-246716 and JP-A-2005-262529, too.

The thickness of the substrate for use in the invention is not specifically limited, and is preferably 30 µm to 700 µm, more preferably 40 µm to 200 µm, further more preferably 50 µm to 150 µm. In each case, the haze value of the substrate is preferably 3% or less, more preferably 2% or less, and further more preferably 1% or less. The all transmission of the substrate is preferably 70% or more, more preferably 80% or more, and further more preferably 90% or more.

(Anode)

In general, the anode may have a function as an electrode capable of supplying a hole into the organic compound layer and is not particularly limited as to its shape, structure and size or the like. The anode can be properly chosen among known electrode materials depending upon the use and purpose of the light-emitting device. As described previously, the anode is usually provided as a transparent anode. The transparent anode is described in detail in *New Developments of Transparent Conducting Films*, supervised by SAWADA, Yutaka (published by CMC Publishing Co., Ltd., 1999). In the case of using a plastic base material with low heat resistance, a transparent anode obtained through fabrication at a low temperature of not higher than 150° C. using ITO or IZO is preferable.

(Cathode)

In general, the cathode may have a function as an electrode capable of injecting an electron into the organic compound layer and is not particularly limited as to its shape, structure and size or the like. The cathode can be properly chosen among known electrode materials depending upon the use and purpose of the light-emitting device.

As materials constituting the cathode, for example, metals, alloys, metal oxides, electric conductive materials or mixtures thereof can be exemplified. Specific examples thereof include alkaline earth metals (for example, Mg and Ca), gold, silver, lead, aluminum, a sodium-potassium alloy, a lithium-aluminum alloy, a magnesium-silver alloy, indium and rare earth metals (for example, ytterbium). Though these materials may be used singly, from the standpoint of making stability and electron injection properties compatible with each other, two or more kinds of these materials can be favorably used in combination.

Of these, in view of electron injection properties, the material constituting the cathode is preferably an alkali metal or an alkaline earth metal; and in view of excellent storage stability, the material constituting the cathode is preferably a material composed mainly of aluminum.

The material composed mainly of aluminum refers to aluminum alone or an alloy of aluminum and from 0.01 to 10% by mass of an alkali metal or an alkaline earth metal or a mixture thereof (for example, a lithium-aluminum alloy and a magnesium-aluminum alloy). The cathode material is described in detail in JP-A-2-15595 and JP-A-5-121172. Also, a dielectric layer composed of a fluoride or oxide of an alkali metal or alkaline earth metal or the like may be inserted in a thickness of from 0.1 to 5 nm between the cathode and the organic compound layer. This dielectric layer can be considered as a certain kind of the electron injection layer.

The thickness of the cathode can be properly chosen depending upon the material constituting the cathode and cannot be unequivocally defined. However, the thickness of the cathode is in general from about 10 nm to 5 μm, and preferably from 50 nm to 1 μm.

Also, the cathode may be transparent or opaque. The transparent cathode can be formed by thinly fabricating the cathode material in a thickness of from 1 to 10 nm and further laminating a transparent conductive material such as ITO and IZO thereon.

(Light-Emitting Layer)

The organic electroluminescent device of the invention has at least one organic compound layer including a light-emitting layer. As described previously, examples of other organic compound layers than the organic light-emitting layer include respective layers such as a hole transport layer, an electron transport layer, a charge blocking layer, a hole injection layer and an electron injection layer.

Organic Light-Emitting Layer

The organic light-emitting layer is a layer having a function such that at the time of application of an electric field, it receives a hole from the anode, the hole injection layer or the hole transport layer and receives an electron from the cathode, the electron injection layer or the electron transport layer to provide a field of recombination of the hole and the electron, thereby achieving light emission. The light-emitting layer may be constituted of only a light-emitting material or may be configured as a mixed layer of a host material and a light-emitting material. The light-emitting material may be a fluorescent light-emitting material or a phosphorescent light-emitting material; and a dopant may be a single material or a combination of two or more kinds of materials. The host material is preferably a charge transport material. The host material may be a single material or a combination of two or more kinds of materials, and examples thereof include a constitution of a mixture of an electron transporting host material and a hole transporting host material. Furthermore, the light-emitting layer may contain a material which does not have charge transporting properties and does not emit light. Also, the light-emitting layer may be a single layer or may be configured of two or more layers, and the respective layers may emit light in a different luminescent color.

Examples of the fluorescent light-emitting material which can be used in the invention include compounds, for example, benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perynone derivatives, oxadiazole derivatives, oxazine derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, diketopyrrolopyrrole derivatives, aromatic dimethylidyne derivatives, various metal complexes represented by metal complexes of 8-quinolinol derivatives and pyrromethene derivatives, polymer compounds (for example, polythiophene, polyphenylene and polyphenylenevinylene) and organosilane derivatives.

Examples of the phosphorescent light-emitting material include complexes containing a transition metal atom or a lanthanoid atom.

The transition metal atom is not particularly limited, and preferred examples thereof include ruthenium, rhodium, palladium, tungsten, rhenium, osmium, iridium and platinum, with rhenium, iridium and platinum being more preferable.

Examples of the lanthanoid atom include lanthanum, cerium, praseodymium, neodymium, samarium, europium, gadolinium, terbium, dysprosium, holmium, erbium, thulium, ytterbium and lutetium. Of these lanthanoid atoms, neodymium, europium and gadolinium are preferable.

Examples of a ligand of the complex include ligands described in G. Wilkinson, et al., *Comprehensive Coordination Chemistry*, published by Pergamon Press, 1987; H. Yersin, *Photochemistry and Photophysics of Coordination Compounds*, published by Springer-Verlag, 1987; and YAMAMOTO, Akio, *Organometallic Chemistry—Principles and Applications*, published by Shokabo Publishing Co., Ltd., 1982.

Also, examples of the host material which is contained in the light-emitting layer in the invention include materials as enumerated in the following paragraphs of hole injection layer, hole transport layer, electron injection layer and electron transport layer as well as a material having a carbazole skeleton, a material having a diarylamine skeleton, a material having a pyridine skeleton, a material having a pyrazine skeleton, a material having a triazine skeleton and a material having an arylsilane skeleton.

Hole Injection Layer and Hole Transport Layer

The hole injection layer and the hole transport layer are each a layer having a function to receive a hole from the anode or the anode side to transport it into the cathode side. Specifically, the hole injection layer and the hole transport layer are each preferably a layer containing a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene based compound, a porphyrin based compound, an organosilane derivative, carbon or the like.

Electron Injection Layer and Electron Transport Layer

The electron injection layer and the electron transport layer are each a layer having a function to receive an electron from the cathode or the cathode side to transport it into the anode side. Specifically, the electron injection layer and the electron transport layer are each preferably a layer containing a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, aromatic ring tetracarboxylic acid anhydrides of naphthalene, perylene, etc., a phthalocyanine derivative, a metal complex of every kind represented by metal complexes of 8-quinolinol derivatives and metal complexes composed of, as a ligand, metal phthalocyanine, benzoxazole or benzothiazole, an organosilane derivative or the like.

Hole Blocking Layer

The hole blocking layer is a layer having a function to prevent a phenomenon in which the hole which has been transported into the light-emitting layer from the anode side passes through into the cathode side from occurring. In the invention, the hole blocking layer can be provided as an organic compound layer which is positioned adjacent to the light-emitting layer on the cathode side.

Examples of an organic compound constituting the hole blocking layer include aluminum complexes such as BAlq, triazole derivatives and phenanthroline derivatives such as BCP. Also, a layer having a function to prevent a phenomenon in which the electron which has been transported into the light-emitting layer from the cathode side passes through into the anode side from occurring may be provided on the position adjacent to the light-emitting layer on the anode side. The hole injection layer and hole transport layer may serve this function.

(Solar Cell)

To The gas barrier film of the invention can be used also as a sealing film for solar cell devices. Preferably, the gas barrier film of the invention is used for sealing a solar cell device in such a manner that its adhesive layer is on the side near to the solar cell device. The solar cell devices for which the gas barrier film of the invention is favorably used are not specifically defined. For example, they include single crystal silicon-based solar cell devices, polycrystalline silicon-based solar cell devices, single-junction or tandem-structure amorphous silicon-based solar cell devices, gallium-arsenic (GaAs), indium-phosphorus (InP) or the like III-V Group compound semiconductor-based solar cell devices, cadmium-tellurium (CdTe) or the like II-VI Group compound semiconductor-based solar cell devices, copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices, dye-sensitized solar cell devices, organic solar cell devices, etc. Above all, in the invention, the solar cell devices are preferably copper/indium/selenium (CIS-based), copper/indium/gallium/selenium (CIGS-based), copper/indium/gallium/selenium/sulfur (CIGSS-based) or the like I-ITT-VT Group compound semiconductor-based solar cell devices.

EXAMPLES

The characteristic features of the invention are hereunder described in more detail with reference to the following Examples. Materials, use amounts, proportions, treatment contents, treatment procedures and the like shown in the following Examples can be properly changed. Accordingly, the scope of the invention should not be limitedly construed by the following specific examples.

Example 1

Production and Evaluation of Gas Barrier Film (1):

Gas barrier films having an inorganic layer and an organic layer provided on a substrate film (samples Nos. 101 to 115) were produced according to the process mentioned below. The details of the constitution of each gas barrier film are shown in Table 1. The substrate film is a polyethylene naphthalate film (PEN, Teijin-Dupont's Q65A having a thickness of 100 µm).

[1] Formation of Inorganic Layer (X):

Using a reactive sputtering apparatus, an inorganic layer of aluminium oxide was formed. The concrete film formation condition is shown below.

The pressure in the vacuum chamber of the reactive sputtering apparatus was reduced to an ultimate pressure of $5 \times 10^{-4}$ Pa, using an oil rotatory pump and a turbomolecular pump. Next, argon was introduced into it as a plasma gas; and a power of 2000 W was applied to it from a plasma source. A high-purity oxygen gas was introduced into the chamber, and the film formation pressure was controlled at 0.3 Pa for a predetermined period of time to form an inorganic layer of aluminium oxide. Thus formed, the aluminium oxide film had a thickness of 40 nm and a film density of 3.01 $g/cm^3$.

[2] Formation of Organic Layer (Y, W, Z, V, U):

The organic layer was formed according to five methods of a solution-coating film formation method under normal pressure (organic layers Y, W, V, U) and a flash vapor deposition method under reduced pressure (organic layer Z). The details of film formation are shown below.

[2-1] Formation of Organic Layer (Y) by Solution Coating Under Normal Pressure:

9 g of a photopolymerizing acrylate, tripropylene glycol diacrylate (TPGDA, by Daicel Sytec) and 0.1 g of a photopolymerization initiator (Ciba Specialty Chemicals' Irgacure 907) were dissolved in 190 g of methyl ethyl ketone to prepare a coating solution. The coating solution was applied onto a substrate film, with a wire bar, and then irradiated with UV rays at an illuminance of 350 mW/$cm^2$ and at a radiation dose of 500 mJ/$cm^2$, using an air-cooling metal halide lamp of 160 W/cm (by Eyegraphics) with nitrogen purging to an oxygen concentration of at most 0.1%, thereby forming an organic layer (Y). The film thickness was about 500 nu.

[2-2] Formation of Organic Layer (W) by Solution Coating Under Normal Pressure:

An organic layer (W) was formed in the same manner as that for the organic layer (Y), for which, however, dipentaerythritol hexaacrylate (DPHA, by Shin-Nakamura Chemical Industry) was used as the photopolymerizing acrylate in place of tripropylene glycol diacrylate (TPGDA). The film thickness was about 500 nm.

[2-3] Formation of Organic Layer (Z) by Flash Vapor Deposition Under Reduced Pressure:

9.7 g of a photopolymerizing acrylate, butylethylpropanediol diacrylate (BEPCA, by Kyoei Chemical) and 0.3 g of a photopolymerization initiator (Lambertispa's Ezacure-TZT) were mixed to prepare a vapor deposition liquid. The vapor deposition liquid was applied onto a substrate for vapor deposition thereon, according to a flash vapor deposition method under a condition of inner pressure of 3 Pa in the vacuum chamber. Next, under the same vacuum degree condition, this was irradiated with UV rays at a radiation dose of 2 J/$cm^2$, thereby forming an organic layer (Z). The film thickness was about 1200 nm. For forming an organic layer Z, used was an organic/inorganic laminate film formation device, Guardian 200 (by Vitex Systems).

[2-4] Formation of Organic Layer (V) by Solution Coating Under Normal Pressure:

9 g of a photopolymerizing acrylate, bisphenol A-type epoxyacrylate (Shin-Nakamura Chemical's NK OligoEA-1020) and 0.1 g of a photopolymerization initiator (Ciba Specialty Chemicals' Irgacure 907) were dissolved in 190 g of methyl ethyl ketone to prepare a coating solution. The coating solution was applied onto a substrate film, using a wire bar, and then irradiated with UV rays at an illuminance of 350 mW/$cm^2$ and at a radiation dose of 500 mJ/$cm^2$, using an air-cooling metal halide lamp of 160 W/cm (by Eyegraphics) with nitrogen purging to an oxygen concentration of at most 0.1%, thereby forming an organic layer (V). The film thickness was about 500 nm.

[2-5] Formation of organic Layer (U) by Solution Coating Under Normal Pressure:

An organic layer (U) was formed in the same manner as that for the organic layer (V), for which, however, epoxyacrylate (Daicel Sytec's EB3702) was used as the photopolymerizing acrylate in place of bisphenol A-type epoxyacrylate (Shin-Nakamura Chemical's NK OligoEA-1020) The film thickness was about 500 nm.

[3] Formation of Barrier Resin Layer (P):

The barrier resin layer was formed according to the following six methods. The details of film formation are shown below.

[3-1] Formation of Barrier Resin Layer (P-1):

Polyvinyl alcohol (PVA 117H by Kuraray) was dissolved in pure water at 2% by weight to prepare a coating solution. The coating solution was applied onto a substrate film, using a wire bar, and dried at 80° C. to form a barrier resin layer (P-1) thereon. The film thickness was about 700 nm.

[3-2] Formation of Barrier Resin Layer (P-2):

Vinylidene chloride copolymer (Saran Resin F216, by Asahi Kasei) was dissolved in a mixed solvent of toluene/tetrahydrofuran=1/2 (by weight) at 15% by weight to prepare a coating solution. The coating solution was applied onto a substrate film, using a wire bar, and dried at 105° C. to form a barrier resin layer (P-2) thereon. The film thickness was about 2.5 μm.

[3-3] Formation of Barrier Resin Layer (P-3):

Ethylene-vinyl alcohol copolymer (Soanol 30L, by Nippon Synthetic Chemical Industry) was dissolved in a mixed solvent of pure water/isopropanol=1/1 (by weight) at 12% by weight to prepare a coating solution. The coating solution was applied onto a substrate film, using a wire bar, and dried at 110° C. to form a barrier resin layer (P-3) thereon. The film thickness was about 2 μm.

[3-4] Formation of Barrier Resin Layer (P-4):

A dispersion (1) prepared by dispersing synthetic mica (tetrasilylic mica (Na-Ts), by Topy Industry) in pure water at 0.65% by weight, and a solution (2) prepared by dissolving polyvinyl alcohol (PVA 210, by Kuraray) in pure water at 0.325% by weight were mixed in a ratio (by volume), in terms of the solid content, of dispersion (1) to solution (2), (1)/(2) =3/7, to thereby prepare a coating liquid. The coating liquid was applied onto a substrate film, using a wire bar, to form a barrier resin layer (P-4) thereon. The film thickness was about 1 μm.

[3-5] Formation of Barrier Resin Layer (P-5):

A barrier resin layer (P-5) was formed in the same manner as that for the barrier resin layer (P-4), for which, however, hydroxyethyl cellulose (by Wako Pure Chemicals) was used in place of polyvinyl alcohol in the solution (2). The film thickness was about 1 μm.

[3-6] Formation of Barrier Resin Layer (P-6):

9 g of a photopolymerizing acrylate, dipentaerythritol hexaacrylate (DPHA, by Shin-Nakamura Chemical) and 0.1 g of a photopolymerization initiator (Ciba Specialty Chemicals' Irgacure 907) were dissolved in 190 g of methyl ethyl ketone to prepare a coating solution. The coating solution was applied onto a substrate film, using a wire bar, and then irradiated with UV rays at an illuminance of 350 mW/cm$^2$ and at a radiation dose of 1 J/cm$^2$, using an air-cooling metal halide lamp of 160 W/cm (by Eyegraphics) with nitrogen purging to an oxygen concentration of at most 0.1%, thereby forming a barrier resin layer (P-6) The film thickness was about 1 μm.

[4] Production of Gas Barrier Film:

Gas barrier films were produced by forming, on a substrate film, the above-mentioned inorganic layer and organic layer in order according to the constitution of the samples shown in Table 1. The films were produced according to the following three methods.

[4-1] Method of Repeating Organic Layer Formation by Solution Coating and Inorganic Layer Formation Under Reduced Pressure (Lamination A):

An organic layer and an inorganic layer were alternately laminated on a substrate film. An inorganic layer was laminated on an organic layer as follows: An organic layer was first formed by solution coating, and then this was put into a vacuum chamber, in which the pressure was reduced to a vacuum degree of at most 10$^{-3}$ Pa. This was kept in the chamber for a predetermined period of time, and then an inorganic layer was formed on it. An organic layer was laminated on the inorganic layer as follows: Immediately after the formation of the inorganic layer, an organic layer was formed thereon according to a solution coating method.

[4-2] Method of Continuous Formation of Organic Layer and Inorganic Layer Under Reduced Pressure (Lamination B):

Using the above-mentioned organic/inorganic laminate film formation apparatus, Guardian 200, an organic layer and an inorganic layer were laminated. In this apparatus, both the organic layer and the inorganic layer are formed in a reduced pressure environment, and the film formation chambers for organic layer and inorganic layer are connected to each other. In this, therefore, the two layers could be continuously formed in a reduced pressure environment. Accordingly, the film is not exposed to air until the completion of barrier film formation.

[4-3] Method of Forming Only the First Organic Layer by Solution Coating Followed by Continuous Formation of the Remaining Layers Under Reduced Pressure (Lamination C):

A first organic layer was formed on a substrate according to a solution coating method. Next, the substrate having the first organic layer was put into a vacuum chamber, in which the pressure was reduced to a vacuum degree of at most 10$^{-3}$ Pa. This was kept in the chamber for a predetermined period of time, and then an inorganic layer and an organic layer were formed alternately.

[5] Evaluation of Physical Properties of Gas Barrier Film:

Using the apparatus mentioned below, physical properties of gas barrier films were evaluated.

[Layer Constitution (Film Thickness)]

An ultra-thin piece of a film sample was observed with a scanning electromicroscope, Hitachirs "S-900 Model".

[Water Vapor Permeability (g/m$^2$/day)]

MOCON's "PERMATRAN-W3/31" (condition: 40° C., 90% RH) was used. The data lower than the detection limit of the MOCON's apparatus, 0.01 g/m$^2$/day were supplemented according to the following method. First, the surface of the gas barrier film is directly coated with a metal Ca by vapor deposition, then the film and a glass substrate were sealed up with a commercially-available organic EL sealant in such a manner that the Ca-coated surface of the film could face inside, thereby preparing a test sample. Next, the test sample is kept under the above-mentioned temperature/humidity condition, and the metal Ca coating on the gas barrier film was checked for the optical density change thereof (the metal gloss reduces owing to hydroxylation or oxidation), from which the water vapor permeability through the film is determined. For the details, referred to is the method described in the following Reference.

<Reference>

G. NISATO, P. C. P. BOUTEN, P. J. SLIKKERVEER, et al.; SID Conference Record of the International Display Research Conference pp. 1435-1438.

[Determination of X-Ray Reflectance (Film Density of Inorganic Layer)]

An inorganic layer was formed on an Si wafer to prepare a test sample, and this was analyzed with Rigaku Denki's ATX-G. From the found data, the film density of the thin film of inorganic layer was computed.

TABLE 1

| Sample No. | Layer Constitution | Lamination Method | Barrier Resin Layer | Water Vapor Permeability (g/m²day) |
|---|---|---|---|---|
| 101 | PEN/Y/X/Y/X | lamination A | — | 0.01 |
| 102 | P-1/PEN/Y/X/Y/X | lamination A | P-1 | 0.01 |
| 103 | P-2/PEN/Y/X/Y/X | lamination A | P-2 | 0.01 |
| 104 | P-3/PEN/Y/X/Y/X | lamination A | P-3 | 0.01 |
| 105 | PEN/Z/X/Z/X | lamination B | — | 0.005 |
| 106 | P-1/PEN/Z/X/Z/X | lamination B | P-1 | 0.005 |
| 107 | P-2/PEN/Z/X/Z/X | lamination B | P-2 | 0.005 |
| 108 | P-3/PEN/Z/X/Z/X | lamination B | P-3 | 0.005 |
| 109 | P-4/PEN/Z/X/Z/X | lamination B | P-4 | 0.005 |
| 110 | P-5/PEN/Z/X/Z/X | lamination B | P-5 | 0.005 |
| 111 | PEN/Y/X/Z/X | lamination C | — | 0.007 |
| 112 | P-4/PEN/Y/X/Z/X | lamination C | P-4 | 0.007 |
| 113 | P-5/PEN/Y/X/Z/X | lamination C | P-5 | 0.007 |
| 114 | PEN/W/X/W/X | lamination A | — | 0.008 |
| 115 | P-6/PEN/W/X/W/X | lamination A | P-6 | 0.008 |
| 116 | P-1/PEN/V/X/V/X | lamination A | P-1 | 0.007 |
| 117 | P-1/PEN/U/X/U/X | lamination A | P-1 | 0.007 |

Example 2

Production and Evaluation of Gas Barrier Film (2):

Gas barrier films (samples Nos. 201 to 208) as in Table 2 were produced in the same manner as in Example 1, for which, however, polyethylene terephthalate (PET, thickness 100 μm, Toray's Lumirror T60) was used as a substrate film.

TABLE 2

| Sample No. | Layer Constitution | Lamination Method | Barrier Resin Layer | Water Vapor Permeability (g/m²day) |
|---|---|---|---|---|
| 201 | PET/Y/X/Y/X | lamination A | — | 0.011 |
| 202 | P-1/PET/Y/X/Y/X | lamination A | P-1 | 0.011 |
| 203 | P-2/PET/Y/X/Y/X | lamination A | P-2 | 0.011 |
| 204 | P-3/PET/Y/X/Y/X | lamination A | P-3 | 0.011 |
| 205 | PET/Z/X/Z/X | lamination B | — | 0.006 |
| 206 | P-1/PET/Z/X/Z/X | lamination B | P-1 | 0.006 |
| 207 | P-2/PET/Z/X/Z/X | lamination B | P-2 | 0.006 |
| 208 | P-3/PET/Z/X/Z/X | lamination B | P-3 | 0.006 |
| 209 | P-1/PET/V/X/V/X | lamination A | P-1 | 0.008 |
| 210 | P-1/PET/U/X/U/X | lamination A | P-1 | 0.008 |

Example 3

Production and Evaluation of Organic EL Device (1):
[1] Preparation of Substrate of Organic EL Device:

An ITO film-having conductive glass substrate (surface resistivity, 10 Ω/square) was washed with 2-propanol, and then processed for UV ozone treatment for 10 minutes. On the substrate (anode), the following organic compound layers were formed in order by vapor deposition according to a vacuum vapor deposition method.
(First Hole Transporting Layer)

Copper phthalocyanine: film thickness 10 nm.
(Second Hole Transporting Layer)

N,N'-diphenyl-N,N'-dinaphthylbenzidine: film thickness 40 nm.
(Light-Emitting Layer Also Serving as Electron Transporting Layer)

Tris(8-hydroxyquinolinato)aluminium: film thickness 60 nm.

Finally, 1 nm of lithium fluoride and 100 nm of metal aluminium were formed in order by vapor deposition, thereby forming a cathode; and a silicon nitride film having a thickness of 3 μm was formed on it according to a parallel plate CVD method, thereby constructing an organic EL device.
[2] Application of Gas Barrier Film on Organic EL Device:

Using a thermosetting adhesive (Epotec 310, by Daizo-Nichimori), the barrier film produced in Example 1 and the organic EL device substrate were stuck together in such a manner that the barrier layer of the film could be on the side of the organic EL device, and heated at 65° C. for 3 hours to cure the adhesive. 20 test pieces of every sample of the thus-sealed organic EL device (samples Nos. 301 to 315) were prepared.
[3] Evaluation of Light-Emitting Surface of Organic EL Device (1):

Just after produced, the organic EL device (samples Nos. 301 to 315) was tested for light emission under application of 7 V thereto, using a source measure unit (SMU2400 Model by Keithley). Using a microscope, the light-emitting surface was observed, which confirmed uniform light emission by every device with no dark spot.

Next, the devices were stored in a dark room at 60° C. and 90% RH for 24 hours, and then tested for light emission. The proportion of the test pieces that gave dark spots larger than 300 μm in diameter is defined as a failure rate. Table 3 shows the failure rate of every tested device.

Example 4

Production and Evaluation of Organic EL Device (2):

Using the gas barrier film produced in Example 2 as a sealing film, sealed organic EL device (samples Nos. 401 to 408) were produced. In applying the gas-barrier layer to the organic EL device, used was a UV-curable adhesive (XNR5516HV, by Nagase-Ciba) but not a thermosetting adhesive. The adhesive was cured with UV rays in an argon gas-purged globe box to adhere the film and the device. Like in Example 3, the samples were stored at 60° C. and 90% RH for 24 hours and tested, and the failure rate was computed. The results are shown in Table 4.

Example 5

Production of Organic EL Device with Gas Barrier Film Serving as Substrate (1):

The gas barrier film produced in Example 1 was introduced into a vacuum chamber, in which a transparent electrode of a thin ITO film having a thickness of 0.2 μm was formed on the film by DC magnetron sputtering with an ITO target. The ITO film-having gas barrier film was put into a washing chamber, and washed with 2-propanol therein, and then processed for UV-ozone treatment for 30 minutes. Using the substrate, an organic EL device (samples Nos. 501 to 508) was produced in the same manner as in Example 3. In the device, both the substrate and the sealing film comprise a resin as the main ingredient thereof, and therefore, the device was flexible as a whole. Like in Example 3, the devices were left at 60° C. and 90% RH for 24 hours, and then tested for the failure rate. The results are shown in Table 5.

TABLE 3

| Sample No. | Gas barrier film Sample No. | Failure Rate of Organic EL Device (%) | Remarks |
|---|---|---|---|
| 301 | 101 | 20 | Comparative Sample |
| 302 | 102 | 11 | the Invention |
| 303 | 103 | 5 | the Invention |
| 304 | 104 | 9 | the Invention |

TABLE 3-continued

| Sample No. | Gas barrier film Sample No. | Failure Rate of Organic EL Device (%) | Remarks |
|---|---|---|---|
| 305 | 105 | 11 | Comparative Sample |
| 306 | 106 | 4 | the Invention |
| 307 | 107 | 1 | the Invention |
| 308 | 108 | 3 | the Invention |
| 309 | 109 | 6 | the Invention |
| 310 | 110 | 9 | the Invention |
| 311 | 111 | 16 | Comparative Sample |
| 312 | 112 | 11 | the Invention |
| 313 | 113 | 14 | the Invention |
| 314 | 114 | 18 | Comparative Sample |
| 315 | 115 | 17 | the Invention |
| 316 | 116 | 8 | the Invention |
| 317 | 117 | 8 | the Invention |

TABLE 4

| Sample No. | Gas barrier film Sample No. | Failure Rate of Organic EL Device (%) | Remarks |
|---|---|---|---|
| 401 | 201 | 22 | Comparative Sample |
| 402 | 202 | 14 | the Invention |
| 403 | 203 | 8 | the Invention |
| 404 | 204 | 13 | the Invention |
| 405 | 205 | 12 | Comparative Sample |
| 406 | 206 | 6 | the Invention |
| 407 | 207 | 3 | the Invention |
| 408 | 208 | 5 | the Invention |
| 409 | 209 | 10 | the Invention |
| 410 | 210 | 10 | the Invention |

TABLE 5

| Sample No. | Gas barrier film Sample No. | Failure Rate of Organic EL Device (%) | Remarks |
|---|---|---|---|
| 501 | 101 | 30 | Comparative Sample |
| 502 | 102 | 16 | the Invention |
| 503 | 103 | 9 | the Invention |
| 504 | 105 | 17 | Comparative Sample |
| 505 | 106 | 7 | the Invention |
| 506 | 107 | 3 | the Invention |
| 507 | 109 | 10 | the Invention |
| 508 | 110 | 11 | the Invention |
| 509 | 116 | 14 | the Invention |
| 510 | 117 | 14 | the Invention |

From the results in Tables 3 to 5, it is confirmed that the barrier film having a barrier resin layer of the invention is superior to the barrier film not having a barrier resin layer in that the failure rate of the organic EL devices with the former is lower. It is also known that the barrier film of the invention is effective both for a sealing film and for a substrate of organic EL devices.

The present disclosure relates to the subject matter contained in Japanese Patent Application No. 238857/2007 filed on Sep. 14, 2007 and Japanese Patent Application No. 140980/2008 filed on May 29, 2008, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas barrier film having, directly on one surface of a substrate film, a gas-barrier layer, and having, on another surface of the substrate film, as a barrier property-having layer, only a layer comprising a harrier property-having resin as a main ingredient of the layer,
wherein:
the gas-barrier layer consists of 3 to 20 alternate organic and inorganic layers, and
the layer comprising a barrier property-having resin as a main ingredient has a water vapor permeability at 25° C. and 50% RH of 0.001 to 10 $g/m^2/day$.

2. The gas barrier film of claim 1, wherein the resin of the layer comprising a harrier property-having resin as the main ingredient of the layer is a polyvinyl alcohol.

3. The gas barrier film of claim 1, wherein the resin of the layer comprising a barrier property-having resin as the main ingredient of the layer is a polyfunctional acrylate.

4. The gas barrier film of claim 1, wherein the organic layer is formed by curing a composition comprising at least one (meth)acrylate having a bisphenol skeleton.

5. The gas barrier film of claim 1, wherein the main ingredient of the layer comprising a barrier property-having resin as the main ingredient of the layer is the same as the main ingredient of the organic layer.

6. The gas barrier film of claim 1, wherein both of the main ingredient of the organic layer and the layer comprising a barrier property-having resin as the main ingredient of the layer are derived from (meth)acrylate.

7. The gas barrier film of claim 1, wherein the thickness of the layer comprising a barrier property-having resin as the main ingredient of the layer is from 0.5 to 30 µm.

8. The gas barrier film of claim 1, which has a thickness of from 10 to 300 µm.

9. The gas barrier film of claim 1, which is for display devices.

10. A method for producing the gas barrier film of claim 1, which comprises providing the gas-barrier layer on a surface of a substrate film and then providing, on the other surface of the substrate film, the layer comprising a barrier property-having resin as the main ingredient of the layer.

11. A display device comprising the gas barrier film of claim 1.

12. The display device of claim 11, wherein the gas barrier film is used for a substrate of the display device.

13. The display device of claim 11, wherein the gas barrier film is used for a sealing film of the display device.

14. The display device of claim 11, wherein the gas barrier film is provided in such a manner that the layer comprising a barrier property-having resin as the main ingredient of the layer is on the outer side of the device.

* * * * *